United States Patent [19]

Kanamori et al.

[11] Patent Number: 4,686,173

[45] Date of Patent: Aug. 11, 1987

[54] ETCHING METHOD EMPLOYING POSITIVE PHOTORESIST FILM

[75] Inventors: Jun Kanamori; Mamoru Yokoyama, both of Tokyo, Japan

[73] Assignee: Oki Electric Industry Co., Ltd., Tokyo, Japan

[21] Appl. No.: 758,073

[22] Filed: Jul. 23, 1985

[30] Foreign Application Priority Data

Jul. 23, 1984 [JP] Japan ................................ 59-151415

[51] Int. Cl.[4] ................................................ G03C 5/00

[52] U.S. Cl. .................................... 430/313; 430/314; 430/317; 430/323; 430/326; 430/327; 430/329

[58] Field of Search ............... 430/313, 317, 323, 326, 430/327, 314, 329

[56] References Cited

U.S. PATENT DOCUMENTS 3,942,982 3/1976 Yanazawa et al. ............. 430/327 X

OTHER PUBLICATIONS

Kirk-Othmer, Encyclopedia of Chemical Technology, 2nd Edition, 1966, vol. 9, pp. 739–743.

Thompson et al., Introduction to Microlithography, Am. Chemical Soc., Washington, DC 1983.

*Primary Examiner*—J. E. Kittle

*Assistant Examiner*—José G. Dees

*Attorney, Agent, or Firm*—Wenderoth, Lind & Ponack

[57] ABSTRACT

An etching method is disclosed including a process of improving the adhesiveness between a positive resist layer and a material layer to be etched. The material layer to be etched is dipped in an organic solvent. The structural body thus-produced in the aforesaid process is placed in the atmosphere of Freon vapor to dry the material layer to be etched. The positive resist film is then formed on the surface of the material layer to be etched.

6 Claims, 12 Drawing Figures

ETCHING METHOD EMPLOYING POSITIVE PHOTORESIST FILM

BACKGROUND OF THE INVENTION

1. Field of the Invention

The present invention relates to an improved etching method for improving the adhesiveness of a photoresist film employed in a photo etching process.

2. Description of the Related Art

Proper etching techniques for photoetching processes are very important in the manufacture of semiconductor devices.

In a prior photoetching process, the use of a positive resist material has been expected to form patterns with accuracy. However, it has been difficult to obtain an etching mask with satisfactory accuracy since the positive resist material has been inferior in adhesiveness to the material to be patterned.

In particular, when the material to be etched is phosphorus silica glass (PSG), the adhesiveness of the positive resist film to the phosphorus glass film is poor. As a result, there has been often produced semiconductor materials which are underetched and which resist peeling.

This phenomenon has been described as follows: The PSG film generally possesses a tetrahedral structure of $SiO_4$, on the surface of which a silanol group layer or a siloxane group layer is formed. This layer has properties which make it likely to adsorb moisture in air and form an adsorbed water layer, hydrogen bouded to the PSG surface. This adsorbed water layer repels organic solvents and deteriorates in its adhesiveness to a positive resist material.

Such adsorbed water can be instantaneously dehydrated by baking. However, it has been difficult to maintain this moisture removal effect over a long period of time, since it rapidly absorbed moisture in the atmosphere because of the presence of silanol groups and siloxane groups.

Conventionally, there has been known a method to overcome such a difficulty wherein after the PSG substrate surface is coated with a material to improve the adhesiveness, for example, an HMDS (hexamethyl disilazane) organic solvent is employed and a positive resist film is formed. This method however has not offered sufficient effect.

SUMMARY OF THE INVENTION

It is an object of the present invention to provide an etching method for reducing the peeling of a positive photoresist layer from the layer of the material to be etched.

Another object of the present invention is to provide an etching method for forming an aperture part through a PSG film with accuracy.

An etching method according to the present invention comprises the steps of: dipping a material layer to be etched in an organic solvent, placing the resultant structure in a Freon vapor to dry the material layer to be etched, and forming a positive resist film on the surface of the material layer to be etched.

The etching method according to the present invention further comprises the steps of: dipping the surface of the material layer to be etched in an organic solvent; placing the material layer to be etched in a Freon vapor; forming a positive resist film; selectively forming an aperture part through the positive resist film to expose the surface of the material layer to be etched removing the exposed material layer to be etched employing the positive resist film as an etching mask; and removing this positive resist film.

The etching method according to the present invention further comprises the steps of: preparing a silicon substrate including a gate insulating film and an silicon gate electrode on the surface thereof; forming a PSG layer on the silicon substrate surface described above; placing the resultant structure in the above process in Freon vapor to dry the PSG film; forming a positive resist layer on the surface of the PSG film; selectively removing this positive resist layer to expose the surface of the PSG film; removing the exposed PSG film to expose the surface of the silicon gate electrode; and after removing the positive resist, forming a metal electrode cȯnnected with the silicon gate electrode.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1A:
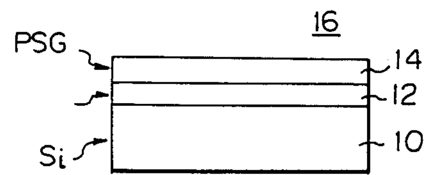
FIGS. 1 (*a*) through 1 (*f*) are cross sectional views, partly including a view of a sample arrangement, illustrating an etching method employing a positive resist material according to the present invention.
Figure 1B:
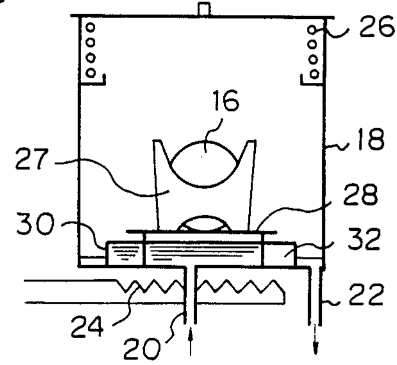
Figure 1C:
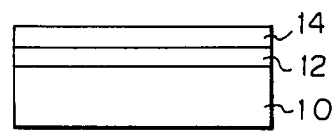
Figure 1D:
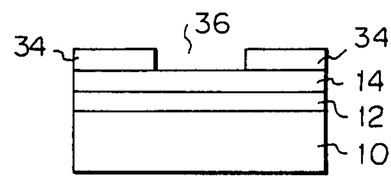
Figure 1E:
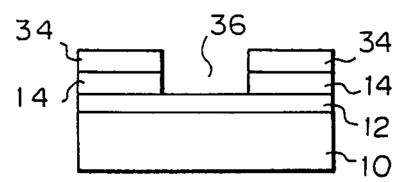
Figure 1F:
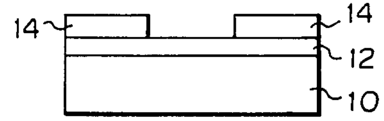
Figure 2A:
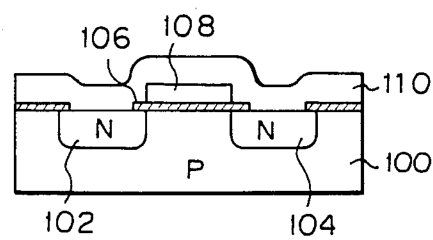
FIGS. 2 (*a*) through (*e*) are cross sectional views showing a manufacturing method of the MOS IC including a positive resist material etching process according to the present invention.
Figure 2B:
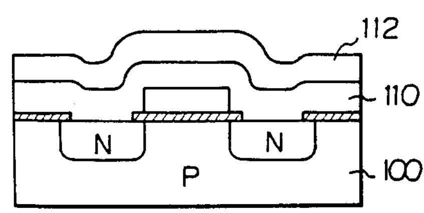
Figure 2C:
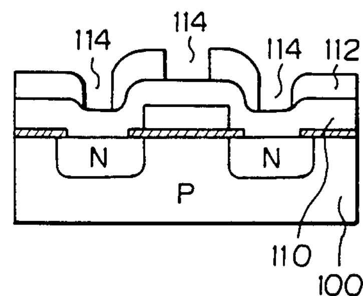
Figure 2D:
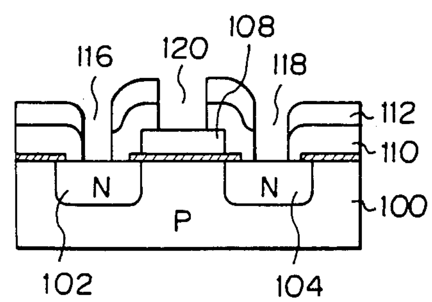
Figure 2E:
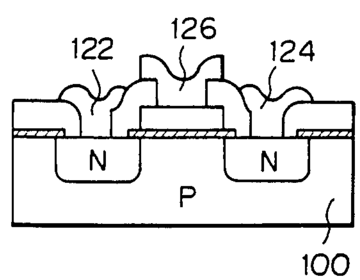

As shown in FIG. 1 (*a*) first, a semiconductor substrate, for example, a silicon substrate 10 is prepared on which a polycrystalline silicon layer 12 is formed. The polycrystalline layer 12 may be of polycrystalline silicon material doped with impurities.

Next, a 5000 to 12000 Å thick insulating film, for example, a PSG film 14 is formed on the surface of the polycrystalline silicon layer 12 by a normal pressure CVD method.

The structural body 16 obtained in the above-described process is dipped in polyhydric alcohol, for example, isopropyl alcohol in a 95% molar ratio for about 3 to 5 minutes. An organic group is substituted for the water absorbing layer on the surface of the PSG layer.

As the polyhydric alcohol, n-propyl alcohol, n-butyl alcohol, isobutyl alcohol, sec-butyl alcohol, and ter 6-butyl alcohol may be employed.

The structural body obtained in the above-described process is placed in, for example, a stainless-made drying device as shown in FIG. 1 (*b*). The drying device comprises a stainless vessel 18, a Freon introducing inlet 20, a Freon delivery outlet 22, a Freon heater 24, and a piping coil 26 for cooling water for Freon convection. A wafer 16 housed in a carrier 27 is disposed on a carrier support 28.

The carrier support 28 is disposed on an Freon reservoir 30 including an freon solution 32 contained therein.

the Freon solution 32 contained therein. The Freon solution 32 is heated to about 40° to 60° C. by a heater 24, and the wafer 16 is dried in Freon vapor for about 10 to 15 minutes. Freon is a halogenated hydrocarbon or mixture of halogenated hydrocarbons containing one or more fluorine atom (a fluorohydrocarbon) and ordinarily used as a refrigerant or propellant.

Isopropyl groups are substituted for the adsorbed water on the PSG layer surface by the treatment described above. The surface of the PSG film 14 is spin-coated with an HMDS (hexamethyl disilazane) organic solvent of about 20 to 100 Å. Then, the surface of the PSG layer is spin-coated as shown in FIG. 1 (*d*) with positive resist, for example, ONPR (Tokyo Oka made) of a thickness of 6000 to 12000 Å. For the positive resist material, NPR 820, NPR809 (KODAK Company made), HPR 2041 (HUNT Company made), MP1400, and AZ1300 (HEXIST Company made) may be employed. The positive resist film is disposed on a hot plate of about 90° to 120° C. and set for about 20 to 60 seconds.

The positive resist layer 34 is, after developed by an ordinary photoetching process, selectively removed to form an aperture part 36 for exposing the PSG layer 14. Successively, the positive resist is used as an etching mask to selectively remove the PSG film with 1 to 5% of a buffered hydrofluoric acid solution as shown in FIG. 1 (*e*).

This etching treatment may be effected by the reactive ion etching of ($CF_4+H_2$) and ($C_2F_6+CHF_3$) or $CHF_3$.

A dry etching method may be employed instead of the etching treatment described above.

According to this method, there was produced no peeling of the positive resist even when a PSG film is subjected to the reactive ion etching under such conditions that the pressure is 80 Pa and the gas mixing ratio of $CHF_3/(C_2F_6+CHF_3)=35\%$ using, for example, an anode coupled parallel plate dry etching device.

Shown in Table 1 are examples of dry etching the PSG film with other gas mixing ratios. It can be seen that said method was produced no peeling of the positive resist film even in a gas mixing ratio of 40% if the PSG surface was dipped in isopropyl alcohol.

TABLE 1

Adhesiveness characteristics of OFPR positive resist/PSG

| | ($CHF_3/(C_2F_6+CHF_3)$) mixing ratio under dry etching condition of pressure of 80 Pa | | |
|---|---|---|---|
| | 30 | 35 | 40 (%) |
| isopropyl alcohol treatment | no peeling | no peeling | no peeling |
| no treatment isopropyl alcohol | no peeling | partial peeling | some peeling |

Conventionally, it was difficult in the region of 40% of the gas mixing ratio to increase the etching selection ratio between the PSG material as well as the silicon material exposed and that between the PSG material and the positive resist material. However, the method according to the present invention enabled a gas mixing ratio to be improved by about 20%.

As described above, in a process according to the present invention, organic groups are substituted for the surface of the PSG layer. Accordingly, the adhesiveness can be improved due to affinity between the organic substrate layer and the positive resist.

The adhesiveness can be checked by observing the presence of any peeling between the positive resist layer and the PSG layer under an optical microscope.

Figure 3:
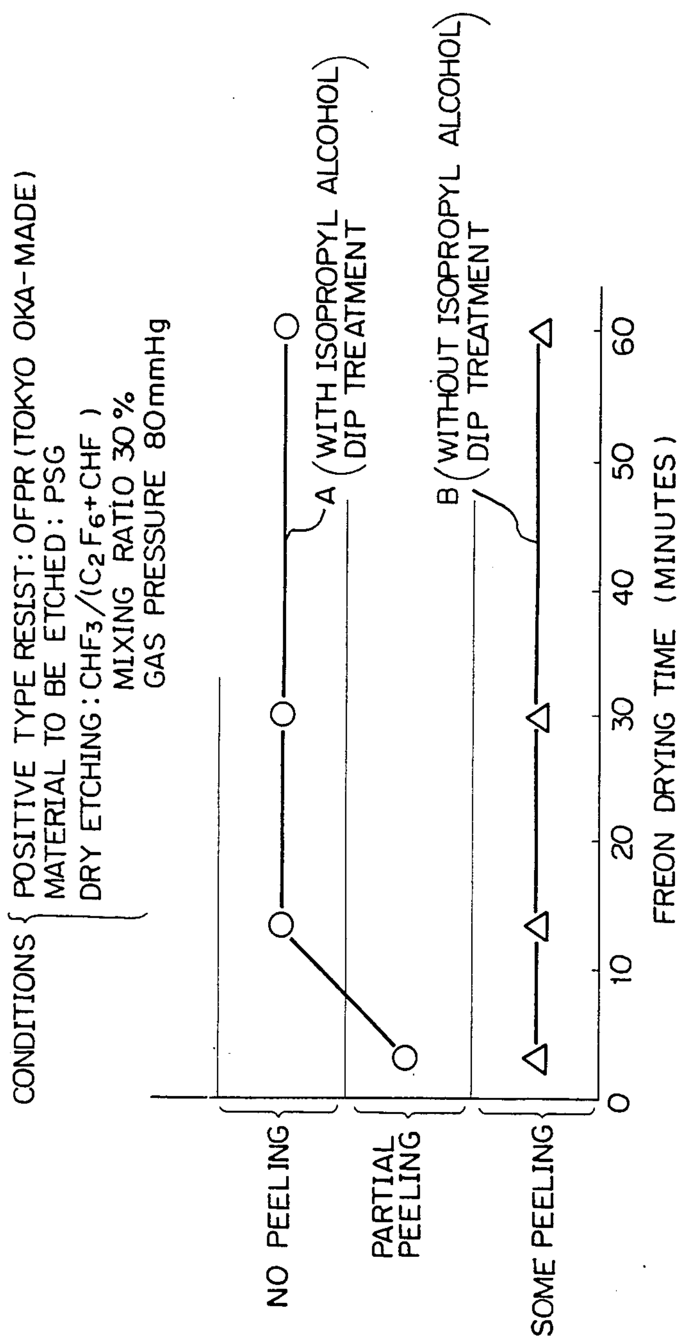
FIG. 3 is a graph showing the adhesiveness charecteristics between the PSG layer and the positive resist layer formed according to the present invention.

A line A in FIG. 3 shows the presence of any peeling of the positive resist layer when a silicon substrate including the PSG film provided thereon is dipped in isopropyl alcohol and thereafter is dried in freon vapor. No peeling of the positive resist film was found upon after drying with Freon for over about five minutes.

The line B in FIG. 3 shows the presence of peeling of the positive resist layer when a silicon substrate including the PSG film provided thereon is not dipped in isopropyl alcohol and is dried in Freon vapor, some peeling is found irrespective of drying time.

Adhesiveness of the PSG film surface to the resist film remains unchanged inasmuch as the organic base layer on the PSG film exists. After leaving behind the PSG film subjected to the above described treatment as it was for 48 hours, the PSG film surface was coated with the positive resist. No reduction (peeling) of the adhesion force was found.

In addition, the organic base layer on the PSG layer surface subjected to the Freon drying treatment is removed simultaneously with the photoresist material in a resist removing process by an $O_2$ plasma treatment or by washing with a mixed solution of sulfuric acid and hydrogen peroxide.

FIG. 2 shows manufacturing processes for a silicon MOS transistor employing an etching method according to the present invention.

In FIG. 2 (*a*), a P type silicon substrate 100 is prepared including source and drain regions 102, 104 of, for example, an N type, a gate insulating film ($SiO_2$) 106, and a gate electrode 108 comprising a polycrystalline silicon doped with impurities.

An about 4000 to 12000 Å thick PSG layer 110 is formed on the surfaces of the silicon gate electrode 108 and the N type diffusion regions 102, 104 of this intermediate structural body of the CVD technique.

The intermediate structural body is dried for 10 to 15 minutes in Freon vapor at a temperature of about 40° to 60° C.

An HMDS (hexamethyl disilazane) organic solvent is applied on the surface of the PSG film 110 into thickness of about 20 to 100 A by spinning coating.

Successively, a positive resist layer 112 is formed as shown in FIG. 2 (*b*) into thickness of about 6000 to 20000 Å by spinning coating.

The positive resist layer 112 is placed on a but plate at about 90 to 120 C and set for about 20 to 60 seconds.

The positive resist layer is developed by the usual photoetching process, selectively removed, and is allowed to form an aperture part 114 for exposing the PSG film 110 (refer to FIG. 1(*c*)).

Then, aperture parts 116, 118 for exposing N type regions 102, 104 and an aperture part 120 for exposing a silicon gate ellectrode 108 are formed taking the positive resist layer as an etching mask as shown in FIG. 1 (*d*). As the etching solution, a buffered solution for example, may be used.

The positive resist film 112 is dipped in, for example, a mixed solution of sulfuric acid and hydrogen peroxide, and completely removed. Then, thick aluminium layer about 6000 to 15,000 Å is vapor-deposited on the surface of the semiconductor substrate 100. The aluminium layer is selectively removed, and a source electrode 122, and a drain electrode 126 are formed as shown in FIG. 2 (*e*).

The etching process according to the present invention can provide a positive resist film with little peeling, thus enabling the aperture part to be highly accurately formed.

In the above description, although PSG was used for the material film to the etched, $Sio_2$, $Al_2O_2$ and Poly Si materials having a surface with water absorbing properties may be also employed.

What is claimed is:

1. An etching method suitable for a semiconductor device manufacturing process comprising the steps of:
(a) dipping a material layer to be etched formed over a semiconductor substrate in an organic solvent;
(b) placing the structure obtained by the step (a) in a fluorohydrocarbon vapor to dry the surface of said material layer to be etched;
(c) forming a layer of positive photoresist over the surface of said material layer;
(d) forming in a selected surface of said positive photoresist layer an opening exposing a surface of said material layer; and
(e) etching said material layer exposed in said opening to form an opening therein, said fluorohydrocarbon vapor of step (b) being used to increase the adhesiveness of the material layer to the photoresist layer by preventing peeling of the photoresist layer from said material layer.

2. An etching method according to claim 1, wherein said material layer to be etched comprises a material selected from the group consisting of PSG, $SiO_2$, and Poly Si, and wherein said organic solvent comprises a compound selected from the group consisting of iospropyl alcohol, n-propyl alcohol, n-butyl alcohol, isobutyl alcohol, n sec-butyl alcohol, and ter 6-butyl alcohol.

3. An etching method according to claim 2, wherein said process (b) comprises the step of subjecting said structure to a fluorohydrocarbon vapor of 40° to 60° C. for 10 to 15 minutes.

4. An etching method adapted for an MOS semiconductor device comprising the steps of:
(a) preparing a silicon semiconductor substrate including a gate insulating layer on the surface of said substrate, and a silicon gate electrode formed on the surface of said gate insulating layer;
(b) forming a PSG layer on the surface of said silicon gate electrode;
(c) dipping the structure obtained by the step (b) in an organic solvent;
(d) placing the structure obtained by the step (c) in a fluorohydrocarbon vapor to dry the surface of said PSG layer;
(e) forming a positive photoresist layer on the surface of said PSG layer;
(f) selectively removing said positive photoresist layer to form an opening exposing a surface of said PSG layer;
(g) removing said exposed PSG layer to form an opening exposing the surface of said silicon gate electrode; and
(h) forming a metal gate electrode connected with said silicon gate electrode after removing said positive photoresist layer, said fluorohydrocarbon vapor of step (d) being used to increase the adhesiveness of the material layer to the photoresist layer by preventing peeling of the photoresist layer from said material layer.

5. An etching method according to claim 4, wherein said organic solvent comprises a compound selected from the group consisting of isopropyl alcohol, n-propyl alcohol, n-butyl alcohol, isobutyl alcohol, sec-butyl alcohol, and ter 6-butyl alcohol.

6. An etching method according to claim 4, wherein said step (d) comprises the step of subjecting said structure to a fluorohydrocarbon vapor of 40° to 60° C. for 10 to 15 minutes.

* * * * *